(12) United States Patent
Tin et al.

(10) Patent No.: US 7,999,268 B2
(45) Date of Patent: Aug. 16, 2011

(54) LOW TEMPERATURE IMPURITY DOPING OF SILICON CARBIDE

(75) Inventors: Chin-Che Tin, Auburn, AL (US); Adetayo Victor Adedeji, Elizabeth City, NC (US); Ilkham Gafurovich Atabayev, Tashkent (UZ); Bakhtiyar Gafurovich Atabaev, Tashkent (UZ); Tojiddin Mutalovich Saliev, Tashkent (UZ); Erkin Nurovich Bakhranov, Tashkent (UZ); Mingyu Li, Auburn, AL (US); Balapuwaduge Suwan Pathum Mendis, Auburn, AL (US); Ayayi Claude Ahyi, Auburn, AL (US)

(73) Assignee: Auburn University, Auburn, AL (US)

( * ) Notice: Subject to any disclaimer, the term of this patent is extended or adjusted under 35 U.S.C. 154(b) by 0 days.

(21) Appl. No.: 12/220,718

(22) Filed: Jul. 25, 2008

(65) Prior Publication Data
US 2009/0039469 A1 Feb. 12, 2009

Related U.S. Application Data

(60) Provisional application No. 60/962,266, filed on Jul. 27, 2007.

(51) Int. Cl.
*H01L 29/15* (2006.01)

(52) U.S. Cl. .......... 257/77; 257/E21.056; 257/607; 438/560; 438/563

(58) Field of Classification Search .......... 257/77, 257/607, E21.056; 438/560, 563
See application file for complete search history.

(56) References Cited

U.S. PATENT DOCUMENTS

| | | | | |
|---|---|---|---|---|
| 5,770,469 A | * | 6/1998 | Uram et al. | 438/246 |
| 6,221,704 B1 | * | 4/2001 | Furukawa et al. | 438/197 |
| 6,300,228 B1 | * | 10/2001 | Adkisson et al. | 438/558 |
| 6,806,173 B1 | * | 10/2004 | Spitz et al. | 438/559 |

* cited by examiner

*Primary Examiner* — Zandra Smith
*Assistant Examiner* — Christy L Novacek
(74) *Attorney, Agent, or Firm* — Haverstock & Owens LLP (57) ABSTRACT

The method described herein enables the introduction of external impurities into Silicon Carbide (SiC) to be conducted at a temperature between 1150-1400° C. Advantages include: a) low temperature diffusion procedure with greater control of the doping process, b) prevent roughness of SiC surface, c) less surface defects and d) better device performance and higher yield. The method described herein involves depositing a ceramic layer that contains the desired impurity and a certain element such as oxygen (in the form of oxide), or other elements/compounds that draw out the silicon and carbon atoms from the surface region of the SiC leaving behind carbon and silicon vacancies which then allow the external impurity to diffuse into the SiC more easily. In another embodiment, the deposited layer also has carbon atoms that discourage carbon from escaping from the SiC, thus generating a surface region of excess carbon in addition to the silicon vacancies.

24 Claims, 11 Drawing Sheets

LOW TEMPERATURE IMPURITY DOPING OF SILICON CARBIDE

CROSS-REFERENCE TO RELATED APPLICATIONS

This application claims the benefit of U.S. Provisional Patent Application Ser. No. 60/962,266, filed Jul. 27, 2007 and entitled LOW TEMPERATURE IMPURITY DOPING OF SILICON CARBIDE; which is hereby incorporated herein by reference in its entirety for all purposes.

GOVERNMENT INTEREST

The U.S. Government has a paid-up license in this invention and the right in limited circumstances to require the patent owner to license others on reasonable terms as provided for by the terms of Contract/Grant No. CRDF-UZE2-2682 TA-05 awarded by the U.S. Civilian Research & Development Foundation (CRDF).

FIELD OF THE INVENTION

The present invention relates to the field of semiconductors. More specifically, the present invention relates to the field of impurity doping at a low temperature.

BACKGROUND OF THE INVENTION

Doping is a necessary step in semiconductor material and device processing. Doping is done by controlled introduction of certain impurity, known as dopant, into a semiconductor to modify its electrical properties such as electrical conductivity, charge carrier concentration, lifetime and type of conductivity. Doping is required for making semiconductor junctions, such as found in diodes, transistors, and others, as well as for making non-rectifying, or ohmic, electrical contact, of low contact resistance, to semiconductor material. Ohmic contact with low contact resistance is more easily fabricated on semiconductor material that has a very high charge carrier concentration.

The conventional methods of introducing dopants in silicon carbide is by ion implantation followed by activation annealing at temperatures between 1400-2200° C. in order to convert the implanted dopants into electrically active species. The higher the activation temperature, the greater the number of impurity atoms that become electrically active. Due to the high activation temperature, the surface of silicon carbide tends to decompose causing surface roughness and generating surface defects. These surface roughness and defects can have a detrimental effect on device performance. For instance, they can degrade channel mobility in silicon carbide metal-oxide-semiconductor field effect transistors to negatively impact device performance. Although activation annealing at a lower temperature is preferred, it does not provide a high enough activation percentage and is therefore inefficient. A low temperature activation annealing is also needed in the fabrication of devices based on the 3C polytype of silicon carbide grown on silicon substrate.

Another conventional method is by thermal diffusion either from gas phase or by proximity annealing. This is done by placing the impurity source in close proximity to the silicon carbide (such as flowing an impurity-containing gas over the sample, placing a solid source next to the silicon carbide sample and flowing inert gas through the chamber so that the impurity is able to be carried by the gas over the silicon carbide sample, evaporating a thin film of the metal directly on the silicon carbide sample, or evaporating a thin film of the metal directly on the silicon carbide) and annealing at temperatures in excess of 1400° C. and even up to 1900° C. The temperature has to be sufficiently high in order to get enough dopant into the sample. A lower annealing temperature, such as what is needed for 3C polytype of silicon carbide grown on silicon substrate, does not provide sufficient doping.

Another commonly used method is by in-situ doping, in which dopants are introduced during crystal growth. In thin film growth of silicon carbide by chemical vapor deposition, in-situ doping is usually done by adding impurities such as nitrogen (by using nitrogen gas or ammonia), aluminum (by using a metalorganic source such trimethylaluminum), boron (by using diborane gas), phosphorous (by using phosphine gas), etc., as part of the process gas into the growth chamber. This technique is preferred when a uniform large area coverage is required but is not suitable when only selected areas on the semiconductor wafer require doping.

A commonly used doping technique in silicon device fabrication is to use commercial spin-on dopant glass compound containing the desired dopant. Most of these spin-on dopant compounds contain both impurity dopant and silicon dioxide in an organic medium or solvent. Some spin-on dopants are also available without silicon dioxide in their formulations. In a typical procedure in silicon wafer processing, a film of spin-on dopant is deposited onto a silicon wafer and spun to obtain a thin uniform layer. The silicon wafer is baked at 100-200° C. to remove the solvent and the wafer loaded into a diffusion chamber. On heating the wafer to a temperature slightly over the melting point of the spin-on dopant, in an atmosphere containing either nitrogen gas or a gas mixture of 90% nitrogen and 10% oxygen, a smooth glassy film is formed on the surface of the wafer. Dopant from the glass is deposited on the surface of the silicon. The formation of silicate glass is to provide an inert barrier against outdiffusion of silicon. Following this step, the wafer is then cooled and removed from the diffusion chamber, and the silicate glass film is removed by wet chemical etching using dilute hydrofluoric acid solution or buffered-oxide-etch (BOE) solution. The wafer is then loaded back into the diffusion chamber and heated to about 1000-1200° C. in an atmosphere containing about 10-25% oxygen in nitrogen gas to allow diffusion, or drive-in, of the dopant into the silicon. The duration of the drive-in step depends on the desired doping depth in the material. An alternative technique of removing the silicate glass film without removing the wafer from the chamber is by heating in steam at about 1050-1250° C. for about 5-20 minutes.

Such spin-on dopants are not usually used for doping silicon carbide material because the method is not effective when employing the typical processing conditions as used in silicon device processing. For instance, nitrogen is a dopant in silicon carbide and therefore nitrogen gas is not formally used in silicon carbide annealing. However, these spin-on dopants such as those containing phosphorus are used in some silicon carbide device fabrication processes to dope other material, such as polysilicon that is used for making the gate contact on silicon carbide metal-oxide-semiconductor field effect transistor (eg. Jianwei Wan, et al., "N-Channel 3C—SiC MOSFETs on Silicon Substrate," IEEE Electron Device Letters, Vol. 23, No. 8, August 2002, pp. 482-484.

Point defects such as vacancies and interstitials are known to play a key role in the diffusion of impurities in semiconductors. Thus, the efficiency of doping in semiconductors can be altered by the presence of these point defects. The interaction between point defects and extrinsic impurities produces localized energy states in the energy band structure of the semiconductor and alter the electronic properties of the material. Extrinsic doping by introducing an impurity produces electrically-active defect center when such impurity occupies a vacant atom site or an interstitial site between the atoms in the atomic lattice of the host semiconductor crystal. Interactions between vacancies, interstitials, and impurities to form larger defect complexes can also occur. Intentionally changing the amount of vacancies can help control the incorporation of impurities in the crystal lattice, and thus control the electrical properties of the semiconductor.

In order to manipulate the defect structure to produce a desired electrical or optical characteristics, certain impurity-related defects are preferred over others depending on the location of the defect levels within the band gap. Several methods are available to selectively favor the creation of a particular type of defects. These methods include co-implantation and co-diffusion of impurities, as well as changing the composition of the gas during epitaxial growth.

In SiC, points defects such as carbon vacancy ($V_C$), silicon vacancies ($V_{Si}$), vacancy-pairs ($V_{Si}$-$V_C$), antisite defects ($C_{Si}$ or $Si_C$), or combination thereof, can interact with extrinsic impurities to modify the electrical properties of SiC. For instance, boron is known to produce two main acceptor levels in SiC.

Miyajima et al. in U.S. Pat. No. 6,133,120 review and discuss the role of boron in SiC and claim that the shallow acceptor level is due to boron occupying a silicon site ($B_{Si}$) whereas the other deeper acceptor level is due boron occupying a carbon vacancy site, VC. However, several works have also shown that the deeper boron acceptor level could be due to a defect complex ($B_{Si}$+$V_C$). Due to its shallower energy level, $B_{Si}$ is the preferred acceptor level for more efficient dopant activation. To promote preferential creation of this $B_{Si}$ defect, various methods have been implemented ranging from co-implantation of boron and carbon or control of the ratio of carbon and silicon atoms in the process gas during epitaxial growth and in-situ doping by chemical vapor deposition.

A model known as "site-competition epitaxy" (D. J. Larkin, P. G. Neudeck, J. A. Powell, and L. G. Matus, Applied Physics Letters 65, 1659 (1994) explains how the incorporation of an impurity in SiC can be controlled by varying the Si/C ratio in the growth ambient during chemical vapor deposition. Varying the Si/C ratio changes the amount of silicon or carbon vacancies to selectively promote or suppress the incorporation of impurity atoms in the vacancies. In-situ doping during epitaxial growth by chemical vapor deposition is carried out at temperatures of about 1450° C. for 4H— and 6H—SiC, and about 1350° C. for 3C—SiC. However, as previously mentioned, in-situ doping by chemical vapor deposition is not suitable for selective doping of certain areas of a silicon carbide wafer.

SUMMARY OF THE INVENTION

In order to create vacancies, such as $V_{Si}$ or $V_C$, to promote impurity dopant incorporation in silicon carbide (SiC), an elevated temperature is required, with a greater number of vacancies being created as temperature increases. The formation energy of such vacancies is positive or endothermic, which means that energy has to be input into the system to form or create the vacancies. For instance, the formation energy of neutral $V_{Si}$ in silicon-rich 4H—SiC is about 8.40-8.45 eV depending on lattice site, and this is an energy loss process.

However, if there is another chemical reaction that has a lower, or even negative (exothermic) formation energy, then it can be used to offset the energy required for vacancy formation. For instance, in the case of silicon carbide, the reaction between silicon and oxygen atoms to form silicon dioxide molecule is an exothermic process providing an energy gain of about 8.3 eV at 298 K assuming the reaction: SiC+$O_2$=$SiO_2$+C being the most probable of all possible oxidation reactions at temperatures below about 1750 K (K. Negita, Journal of the American Ceramic Society, Vol. 69, No. 12, pp. C308-310 (1986). Therefore, by heating silicon carbide in the presence of oxygen, the process of silicon atoms from the silicon carbide crystal reacting with the oxygen atoms to form silicon dioxide, and leaving behind silicon vacancies in the crystal is an energetically favorable process. The same is true if an oxide layer is place on top of the silicon carbide surface and heated to a sufficiently high temperature to cause the silicon atoms in the silicon carbide to diffuse into the oxide layer above to form silicon dioxide, leaving behind silicon vacancies. In other words, this chemical reaction between the silicon in the silicon carbide and the oxygen in the oxide layer assists in the creation of vacancies. Consequently, silicon vacancies can be created in the silicon carbide crystal at a lower temperature.

The presence of the silicon vacancies then assists in the diffusion of impurity or dopant atoms into the silicon carbide crystal by allowing the dopant atoms to occupy the vacant silicon sites. The formation energy of a neutral phosphorus dopant occupying a silicon vacancy in 4H—SiC is between 9-10 eV depending on the defect configuration. In the case of neutral boron occupying a silicon vacancy in 4H—SiC, the formation energy is between 6-7 eV. This process requires an energy input but the overall energy needs is still less than that of a process without oxidation.

The method of this invention combines the process of oxide-assisted vacancy creation with the process of external impurity diffusion to enable the overall impurity doping process to be energetically favorable and made possible at lower temperatures.

The method of this invention can also apply if the assisting chemical reaction (such as oxidation, nitridation, or carbonization) gives rise to a compound that has a lower formation energy compared to the formation energy of the native elements that make up the semiconductor material.

The theoretical basis of this method can also be arrived at by comparing the relative stability and formation energy of metal carbide or metal oxide with that of silicon carbide. Such comparison can be used to find suitable materials for use with this method.

The method described herein enables the introduction of external impurities into Silicon Carbide (SiC) to be conducted at a temperature between 1150-1400° C. Further, this method preferentially creates one type of vacancy over the other, thus encouraging the diffusion of dopant into a preferred predominant vacancy to preferentially form the desired defects. Advantages include: a) low temperature diffusion procedure with better control of the doping process, b) prevent roughness of SiC surface, c) less surface defects and d) better device performance and higher yield. The method described herein involves depositing a ceramic layer that contains the desired impurity and a certain element such as oxygen (in the form of oxide), or other elements/compounds (e.g. nitrides and carbides) that draw out the silicon and carbon atoms from the surface region of the SiC leaving behind carbon and/or silicon vacancies which then allow the external impurity to diffuse into the SiC more easily. In another embodiment, the deposited layer also has carbon atoms that discourage carbon from escaping from the SiC, thus generating a surface region of excess carbon in addition to the silicon vacancies.

In one aspect, a method of doping a material comprises depositing a layer on the material, the layer including an impurity and an oxide, the layer and the material forming a sample and heating the sample at a diffusion temperature. The method further comprising heating the sample at a lower temperature before heating the sample at the diffusion temperature. Depositing is selected from the group consisting of dipping, spinning, brushing and dropping droplets with a dropper. The material is silicon carbide. In some embodiments, the layer comprises a phosphorus impurity. In some embodiments, the layer comprises phosphorus oxide and a component containing carbon. In some embodiments, the layer comprises phosphorus and a component containing silicon but not carbon. In some embodiments, the layer comprises a boron impurity. In some embodiments, the layer comprises an element that is able to form a chemical bond with silicon with a formation energy lower than that of the bonding between silicon and carbon atoms in a surface region of silicon carbide. In some embodiments, the layer comprises an element that is able to bond easily with a carbon atom with a formation energy lower than that of the bonding between silicon and carbon in a surface region of silicon carbide. In some embodiments, the layer comprises a chemical that allows a solution of the layer to wet the surface of the sample and produces a uniformly thin film when the sample is spun in a spin-coater. The lower temperature is approximately 650° C. The diffusion temperature is between 1150-1400° C. The method further comprises drying the sample. The method further comprises forming a solution to be deposited as the layer. The method further comprises removing the deposited layer from the sample, upon the sample cooling. The deposited layer is removed by etching in a solution of hydrofluoric acid in water. In another embodiment, the first temperature at 650° C. can be skipped which means heating the sample to the final temperature of 1150-1400° C. in a single step.

In another aspect, an n-type silicon carbide semiconductor in which phosphorus, or a Group V metal, is used as impurity in a silicon carbide substrate, the n-type silicon carbide semiconductor formed by depositing a layer on a silicon carbide material, the layer including a phosphorus, or a Group V metal, impurity and an oxide, the layer and the silicon carbide material forming a sample, heating the sample at a first temperature and heating the sample at a second temperature. Depositing is selected from the group consisting of dipping, spinning, brushing and dropping droplets with a dropper. In some embodiments, the layer comprises a phosphorus impurity. In some embodiments, the layer comprises phosphorus oxide. The first temperature is approximately 650° C. The second temperature is between 1150-1400° C. The deposited layer is removed by etching in a solution of hydrofluoric acid in water. The sample is dried. The deposited layer is removed from the sample, upon the sample cooling. The deposited layer is removed by etching in a solution of hydrofluoric acid in water. In another embodiment, the first temperature step is skipped and the sample is heated to the final temperature of 1150-1400° C. in a single step.

In yet another aspect, a p-type silicon carbide semiconductor in which boron, or a group III element, is used as an acceptor impurity in a silicon carbide substrate, the p-type silicon carbide semiconductor formed by depositing a layer on a silicon carbide material, the layer including a boron or group III impurity and an oxide, the layer and the silicon carbide material forming a sample, heating the sample at a first temperature and heating the sample at a second temperature. Depositing is selected from the group consisting of dipping, spinning, brushing and dropping droplets with a dropper. In some embodiments, the layer comprises a boron impurity. In some embodiments, the layer comprises boron oxide. In some embodiments, the layer comprises an element that is able to form a chemical bond with silicon with a formation energy lower than that of the bonding between silicon and carbon atoms in a surface region of silicon carbide. The first temperature is approximately 650° C. The second temperature is between 1150-1400° C. In another embodiment, the first temperature step is skipped and the sample is heated to the final temperature of 1150° C. in a single step. In some embodiments, the layer comprises an element that is able to bond easily with a carbon atom with a bonding energy lower than that of the bonding energy between silicon and carbon in a surface region of silicon carbide. The deposited layer is removed by etching in a solution of hydrofluoric acid in water.

In another aspect of this invention, a post-diffusion annealing following dopant diffusion at the final temperature of 1150-1400° C. can heal any crystalline damage caused by the dopant diffusion process. In one embodiment of this method, the sample is annealed at a temperature of about 500° C. for about 5-10 minutes in vacuum. In yet another embodiment of this method, the sample is annealed at a temperature of about 700° C. for about 5-10 minutes in vacuum. In yet another embodiment of this method, the post-diffusion annealing temperature must not be above 900° C. to prevent damage to the crystalline structure.

DETAILED DESCRIPTION OF THE PREFERRED EMBODIMENT

The introduction of impurities, known as doping is a crucial step in electronic device fabrication. Doping of silicon carbide (SiC) by impurities typically requires an activation or diffusion step conducted at high temperature between 1400° C. and 2200° C. At such high temperatures, surface decomposition is able to occur, which then leads to poor device performance and yield. To prevent surface decomposition, elaborate steps are needed to provide an overpressure of silicon atoms at the surface of SiC. However, due to the high temperature, a certain degree of surface damage is still inevitable. Also, any process that requires a temperature greater than about 1420° C. should not be applied for any polytype of silicon carbide deposited on silicon substrate because the silicon substrate will melt. The method described herein enables the introduction of external impurities into SiC to be conducted at a temperature between 1150-1400° C. The advantages of the method include: a) low temperature diffusion procedure with better control of the doping process, b) prevent roughness of SiC surface, c) less surface defects and d) better device performance and higher yield. The method described herein involves depositing a ceramic layer that contains the desired impurity and a certain element such as oxygen (in the form of oxide), or other elements or compounds that draw out the silicon and carbon atoms from the surface region of the SiC leaving behind carbon and silicon vacancies which then allow the external impurity to diffuse into the SiC more easily. In another embodiment, the deposited layer also has carbon atoms that discourage carbon from escaping from SiC, thus generating a surface region of excess carbon in addition to the silicon vacancies.

I. G. Atabaev et al., described in Uzbekistan Patent No. UZ IAP02792, a method in which a saturated solution of boric acid or boron anhydride in methanol is deposited on the surface of silicon carbide by dipping the latter in the solution. The sample is then dried and annealed at 650° C. in air. This initial annealing step is followed by a drive-in diffusion step which involves increasing the sample temperature to between 1150-1400° C. for 15-30 minutes to form a layer of borosilicate glass that acts as a source of boron to dope the silicon carbide layer. They attributed the observed higher diffusion rate of boron in their samples to the interaction between the carbon sublattice and air to create vacancies in the crystal.

The method described in the Uzbekistan patent does not provide a uniform film of boron compound on the surface of silicon carbide because the solution in methanol will not wet or adhere uniformly to the surface of the SiC. Consequently, there will be patches on the surface of the sample where there are too many boron atoms than other parts of the sample causing surface deterioration and more surface defects.

Figure 1:
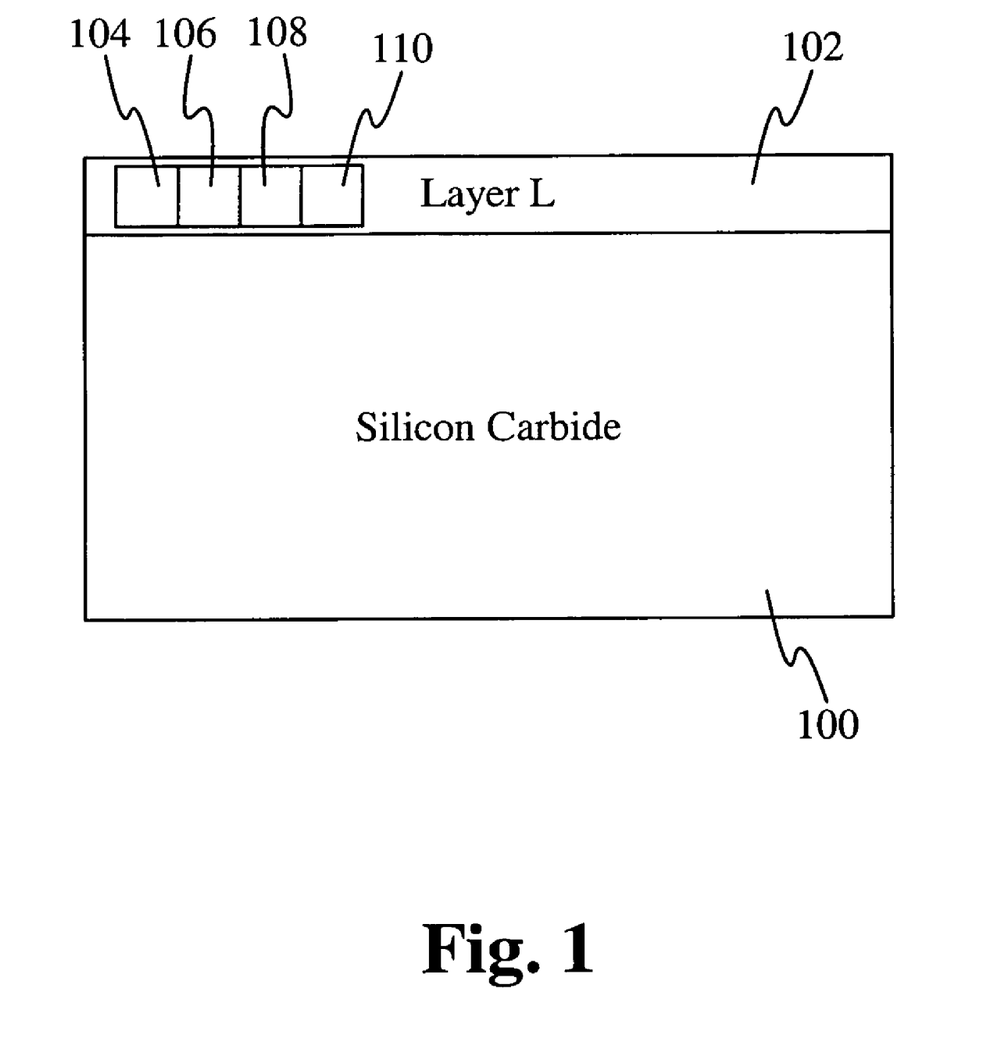
FIG. 1 illustrates a block diagram of silicon carbide with a layer L.
Figure 2:
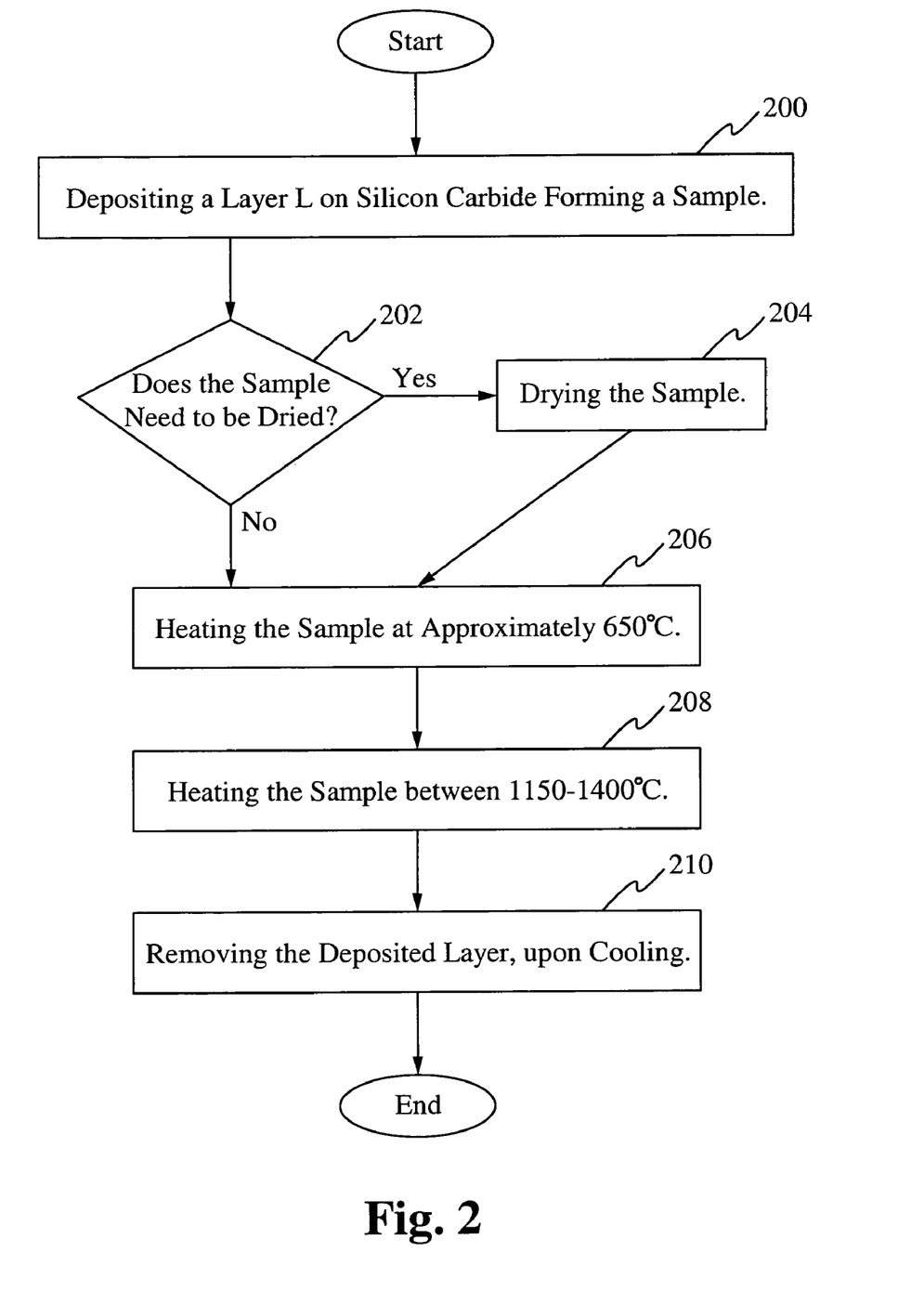
FIG. 2 illustrates a flow chart of a method of doping silicon carbide.

FIG. 1 illustrates a block diagram of a layer L 102 including several components deposited on silicon carbide 100. FIG. 2, in conjunction with FIG. 1, illustrates a method of doping silicon carbide.

In some embodiments, a layer L 102 including several components is deposited on silicon carbide 100, in the step 200. The layer L 102 is able to be a saturated liquid solution that is deposited on the surface of silicon carbide 100 by dipping, spinning, brushing or just introducing droplets from a dropper. The layer L 102 is also able to be deposited on silicon carbide 100 using evaporation of a solid source or sputtering of a solid target. Other methods of depositing the layer L 102 are also possible.

One of the components in the layer L 102 is a desired impurity 104 to be introduced into the silicon carbide 100. As is described below in some embodiments, the impurity is phosphorus.

In some embodiments, a component 106 in the layer L 102 is able to be an element that is able to form a chemical bond with silicon with a formation energy lower than that of the bonding between silicon and carbon atoms in the surface region of silicon carbide 100. In an embodiment, this element is oxygen (in the form of oxide of the impurity).

In some embodiments, a component 108 in the layer L 102 is able to be an element that is able to bond easily with a carbon atom with a formation energy lower than that of the bonding between silicon and carbon in the surface region of silicon carbide 100. In an embodiment, this element is oxygen (in the form of the oxide of the impurity or in air).

In some embodiments, a component 110 in the layer L 102 is able to be any chemical that allows the mixture to wet the surface of the semiconductor sample and produces a uniformly thin film when the sample is rotated or spun as in a spin-coater. In some embodiments, other and/or additional components are included in the layer L 102.

In the step 202, it is determined if the sample of silicon carbide 100 and layer L 102 needs to be dried. If the layer L 102 is formed from a liquid solution, the sample, including the silicon carbide 100 and the deposited layer L 102 is then baked in an oven or air-dried to remove the solvent in the layer L 102, in the step 204. If the layer L 102 is formed from a solid through vacuum evaporation or sputtering, then no drying is necessary.

In the step 206, the silicon carbide 100 with the deposited layer L 102 is then heated in oxygen at approximately 650° C. to form a glass-like layer L 102. This step allows the layer L 102 to flow and distribute the impurity compound uniformly, or planarize, over the surface.

In the step 208, the silicon carbide 100 with the deposited layer L 102 is then heated in oxygen at a temperature between 1150-1400° C. for 30 minutes or longer depending on the depth of diffusion.

In the step 210, on cooling to the ambient temperature, the deposited layer L 102 is then removed from the silicon carbide 100 by etching in a solution of hydrofluoric acid in water or by another means.

Figure 3:
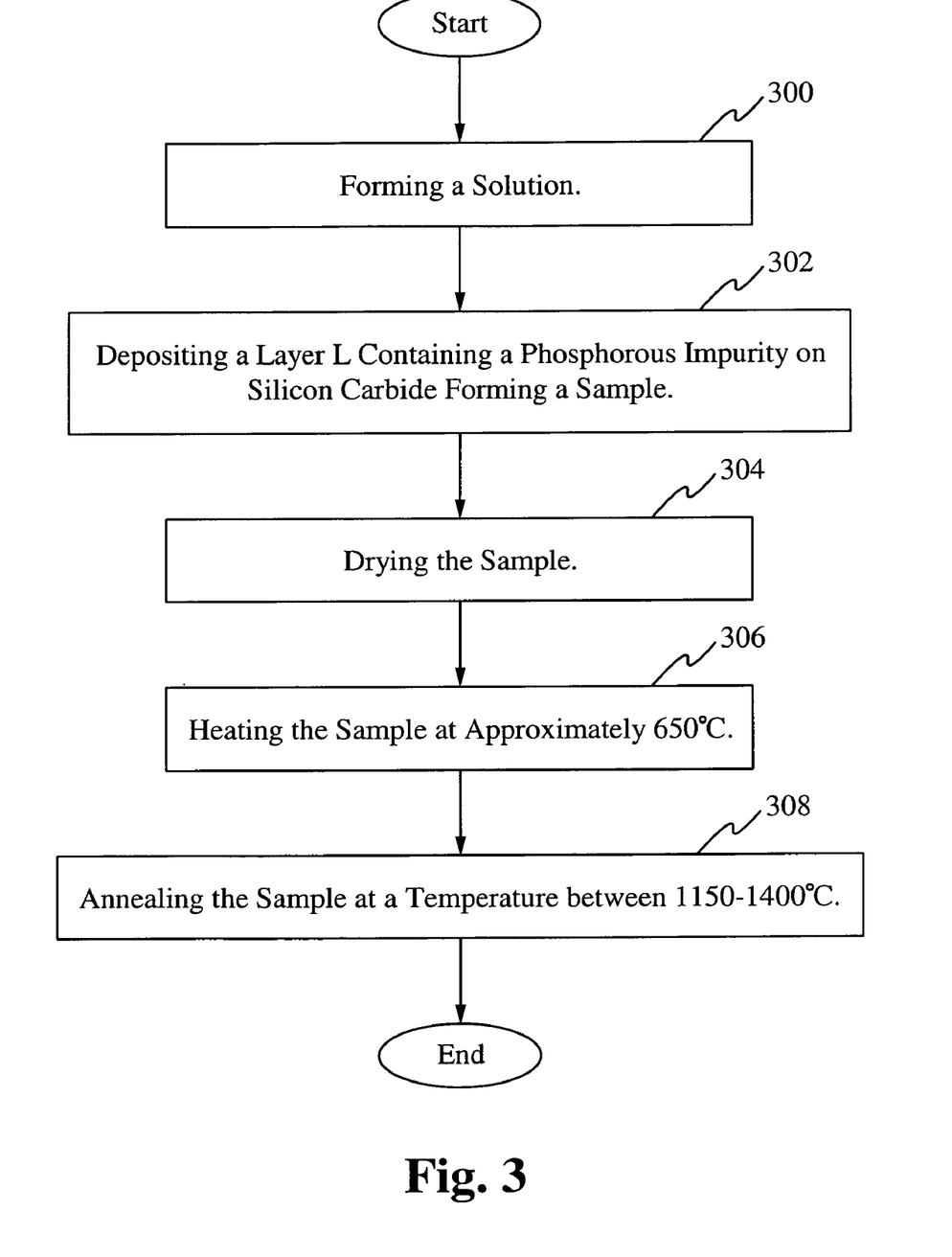
FIG. 3 illustrates a flow chart of a method of doping silicon carbide with a phosphorus impurity.

FIG. 3 illustrates a flow chart of a method of doping silicon carbide with a phosphorus impurity. In some embodiments, the method is able to be used to introduce phosphorus impurity into silicon carbide 100. Phosphorus oxide is used as one component of the deposited layer L 102. A solution of phosphorus oxide in methanol is formed by adding a sufficient amount of phosphorus oxide powder into methanol and stirred until the solution is saturated, in the step 300. The saturated solution is then deposited on top of the silicon carbide surface by either dipping, or dropping a few droplets from a dropper or another method, in the step 302. The method of deposition used depends on the size of the sample. In some embodiments of the method of preparing the phosphorus compound, a surfactant, polymer, or solvent is used instead of, or with, methanol such that the compound has the ability and consistency to wet the surface of silicon carbide and allowing the compound to be deposited by spinning in a spin-coater. A uniform film is formed after drying, in the step 304. In some embodiments, silicon from the silicon carbide surface bonds with the oxygen in the phosphorus oxide in layer L 102 to form a uniform layer of phosphosilicate glass when the sample is heated in oxygen at approximately 650° C., in the step 306. Carbon atoms from the surface of silicon carbide 100 also diffuse out and vaporize either after combining with the oxygen in the phosphorus oxide or with the oxygen in the atmosphere in the chamber. The end result is that both silicon and carbon vacancies are formed at the surface region of the silicon carbide 100. In some embodiments, the step 306 is skipped. In the subsequent annealing at a temperature between 1150-1400° C., in the step 308, the phosphorus impurity from the layer L 102 diffuses into the silicon carbide surface region to occupy the vacant sites left behind by the silicon and carbon atoms. The presence of these vacancies enhances the diffusion rate of the phosphorus impurity, thus enabling the process to be performed at a lower temperature of 1150-1400° C. In this embodiment, the region of the silicon carbide surface into which phosphorus is incorporated is converted to n-type.

Figure 4:
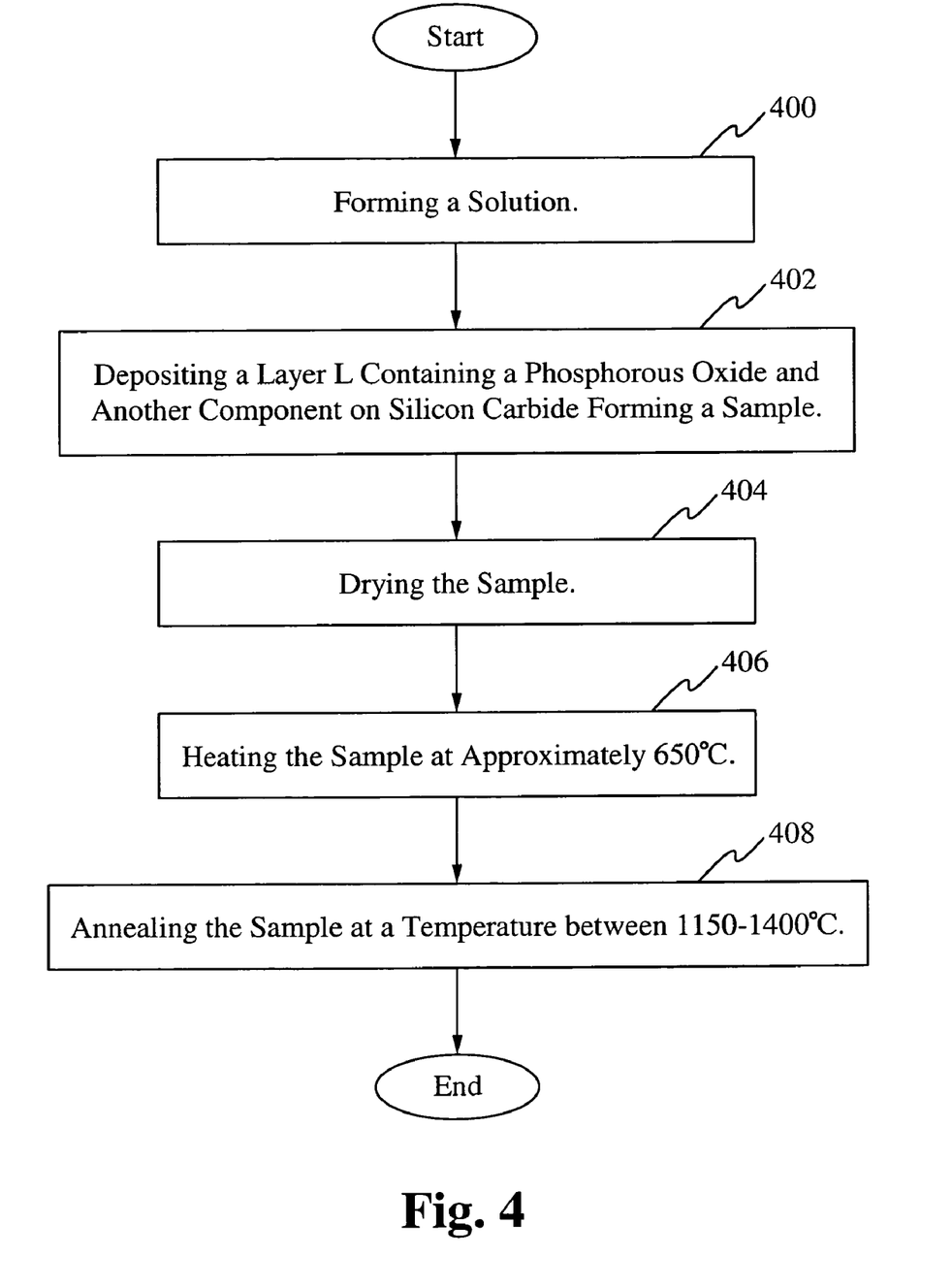
FIG. 4 illustrates a flow chart of a method of doping silicon carbide with phosphorus oxide with another component.

FIG. 4 illustrates a flow chart of a method of doping silicon carbide with phosphorus oxide with another component. In some embodiments, the layer L 102 includes a component that contains phosphorus oxide together with another component that contains carbon or any compound of carbon such as photoresist or organic compound. After generating a mixture with a suitable solvent in the step 400, the mixture or solution is deposited as the layer L 102 on the silicon carbide 100 by dipping, brushing, spinning, through droplets or another method, in the step 402. In one embodiment, the carbon compound can be deposited as a separate layer above layer L 102. After undergoing drying in the step 404, the sample with layer L 102 is heated in a vacuum, or an inert atmosphere, at approximately 650° C., in the step 406. The carbon containing component of the layer L 102 is converted into graphite. This generates a diffusion barrier discouraging the carbon atoms at or near the silicon carbide surface from escaping from the silicon carbide surface. It is also possible that carbon from the graphitized layer is able to diffuse into the silicon carbide surface region. The sample is then heated to the diffusion temperature of 1150-1400° C., in the step 408, for dopant diffusion into the silicon carbide to occur. Due to the lower formation energy between silicon and oxygen compared to that of the bonding between silicon and carbon, silicon atoms are drawn from the silicon carbide surface to bond with the oxygen in the layer L 102 to form a uniform layer of phosphosilicate glass when the sample is heated in a vacuum, argon or any inert gas, at approximately 650° C. When the sample is heated at 1150-1400° C., dopant impurity diffuses into the silicon carbide. The combined effect of the out-diffusion of silicon and the suppression of carbon loss is that a region containing excess carbon (carbon-rich) as well as silicon vacancies is formed on the surface of silicon carbide 100 allowing the phosphorus impurity to diffuse preferentially into the silicon vacancies.

Figure 5:
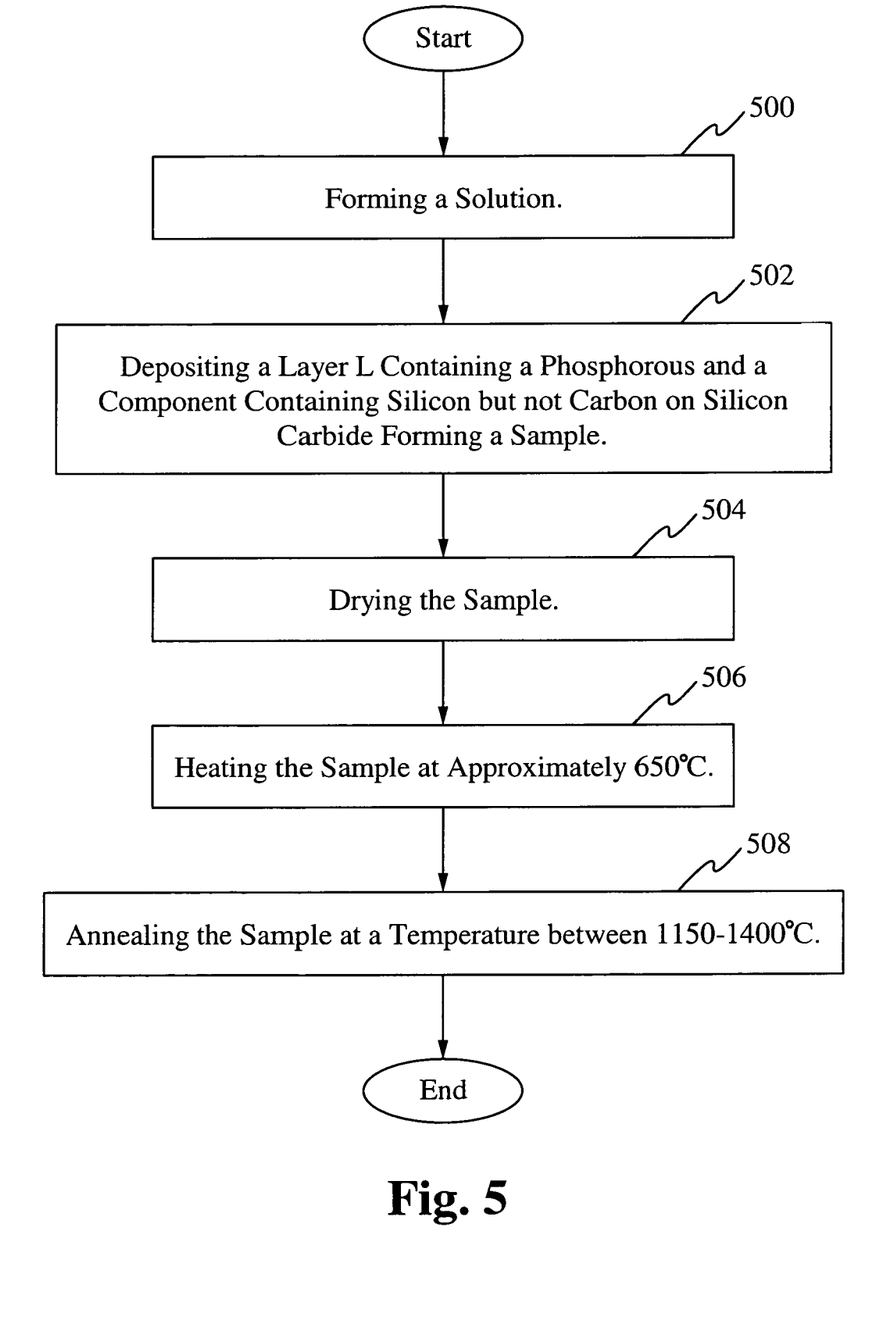
FIG. 5 illustrates a flow chart of a method of doping silicon carbide with phosphorus and a component that contains silicon but not carbon.

FIG. 5 illustrates a flow chart of a method of doping silicon carbide with phosphorus and a component that contains silicon but not carbon. In some embodiments, the layer L 102 has a component that contains phosphorus together with another component that contains silicon dioxide or any compound containing silicon but does not contain carbon or any compound of carbon such as photoresist or organic compound. After generating a mixture with a suitable solvent, in the step 500, the mixture or solution is deposited as the layer L 102 on the silicon carbide 100 by dipping, brushing, spinning, through droplets or another method, in the step 502, making sure that a uniform film is deposited on the silicon carbide surface. After undergoing drying in the step 504, the sample with layer L 102 is heated in oxygen at approximately 650° C., in the step 506. At this temperature, the silicon-containing component of the layer L 102 generates a diffusion barrier discouraging the silicon atoms at or near the silicon carbide surface from escaping from the silicon carbide surface. The sample is then heated to the diffusion temperature of 1150-1400° C., in the step 508, for dopant diffusion into the silicon carbide to occur. Due to the lower formation energy between carbon and oxygen compared to that of the bonding between silicon and carbon, the carbon atoms are drawn from the silicon carbide surface to bond with the oxygen or hydrogen in layer L 102 or oxygen and evaporate. The combined effect of the outdiffusion of carbon and the suppression of silicon loss is that a region containing excess silicon (silicon-rich) as well as carbon vacancies is formed on the surface of silicon carbide 100 allowing phosphorus impurity to diffuse preferentially into the carbon vacancies when the sample is finally heated at the diffusion temperature of 1150-1400° C.

Figure 6:
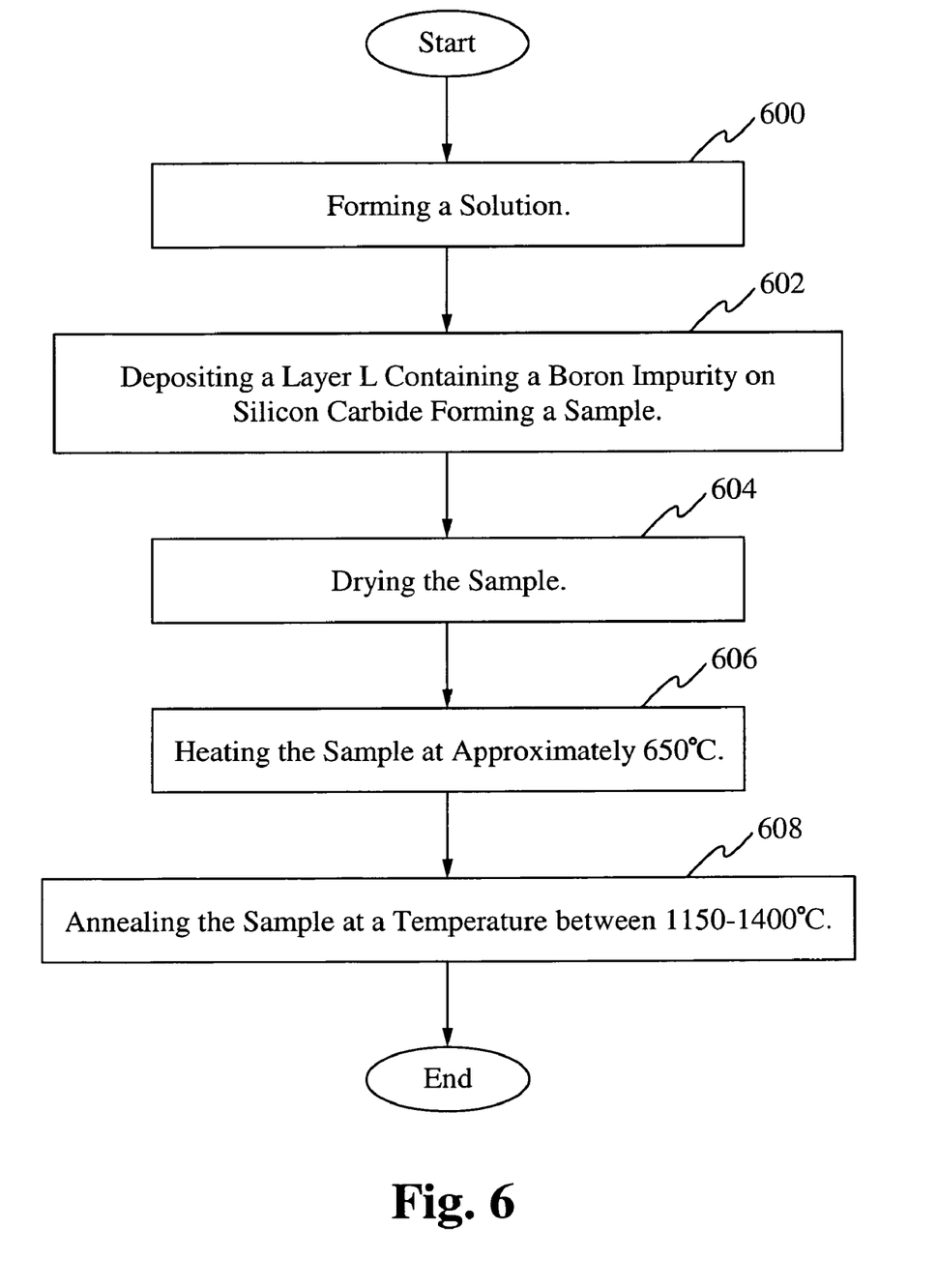
FIG. 6 illustrates a flow chart of a method of doping silicon carbide with a boron impurity.

FIG. 6 illustrates a flow chart of a method of doping silicon carbide with a boron impurity. In some embodiments, to introduce boron impurity into a carbon-rich silicon carbide surface, the deposited layer L 102 is able to contain a carbon compound in addition to the impurity. The silicon carbide surface is first converted into a region that has excess carbon atoms or carbon-rich as well as generating silicon vacancies in the same region. Impurity from the deposited layer L 102 is able to then preferentially occupy mostly the silicon vacancies. In this embodiment, boron oxide is used as one component of the layer L 102. In the step 600, a solution of boron oxide in methanol is formed by adding a sufficient amount of boron oxide powder into methanol and stirred until the solution is saturated. In one embodiment, the source of boron oxide is triethylborate, or other borates that can be deposited on the silicon carbide by spinning, and can dry easily. In another embodiment, the liquid source of boron oxide is made by dissolving 0.74 grams of boron oxide in 5 milliliter of methanol, and then adding 5 milliliter of ethanol, and 9 milliliter of isopropanol, to make a solution that can be deposited on the silicon carbide by spinning. A polymer or photoresist is added to the boron oxide solution to provide the carbon source. In another embodiment, the mixture of boron oxide, methanol, ethanol and isopropanol can be a composition different from that mentioned here. A uniform film is obtained if the sample is spun at about 2000 revolutions per minute, or other appropriate speed. In the step 602, the saturated solution is then deposited on top of the silicon carbide surface as described above, again making sure that a uniform film is formed after drying, in the step 604. In this embodiment, due to the lower formation energy between silicon and oxygen compared to that of the bonding between silicon and carbon, silicon atoms are drawn from the silicon carbide surface to bond with the oxygen from the boron oxide in layer L 102 to form a uniform layer of boronsilicate glass when the sample is heated in vacuum, argon or any inert gas, at approximately 650° C., in the step 606. The carbon-containing component in the deposited layer L 102 is converted into graphite which acts as a barrier discouraging carbon atoms at or near the surface of silicon carbide 100 from diffusing out and vaporizing. The end result is that silicon vacancies are formed at the surface region of silicon carbide 100 that also contains excess carbon atoms, or carbon-rich. In some embodiments, the step 606 is skipped. In the subsequent annealing at a temperature between 1150-1400° C., in the step 608, the boron impurity from the deposited layer L 102 diffuses into the silicon carbide surface region to occupy the vacant sites left behind by the silicon atoms. The presence of these silicon vacancies and excess carbon atoms enables the boron impurity to occupy mostly the silicon vacancies. The silicon vacancies enhance the diffusion rate of the boron impurity, thus enabling the process to be performed at a lower temperature of 1150-1400° C.

Figures 7A, 7B:
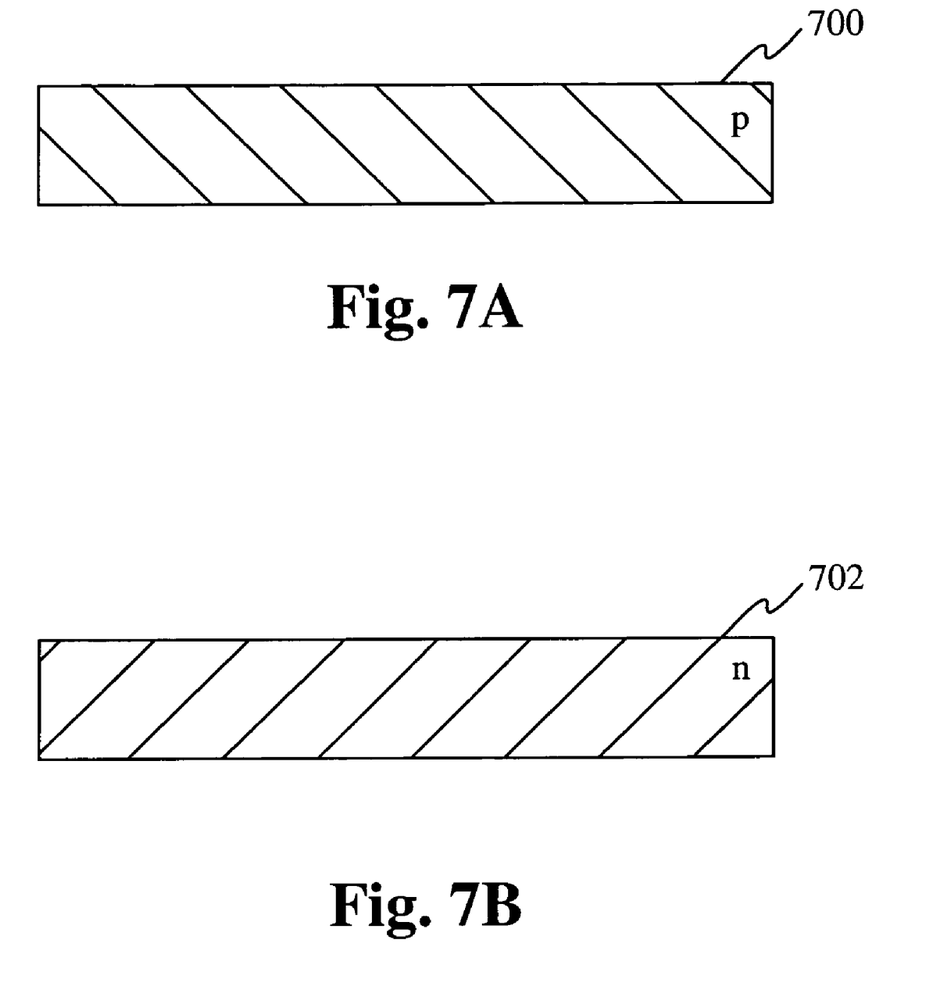
FIG. 7A illustrates a p-type semiconductor generated using a method described herein.
FIG. 7B illustrates an n-type semiconductor generated using a method described herein.

FIG. 7A illustrates a p-type semiconductor 700 generated using a method described herein. The p-type semiconductor 700 is able to be used in any device that utilizes a p-type semiconductor. FIG. 7B illustrates an n-type semiconductor 702 generated using a method described herein. The n-type semiconductor 702 is able to be used in any device that utilizes an n-type semiconductor.

Figure 8:
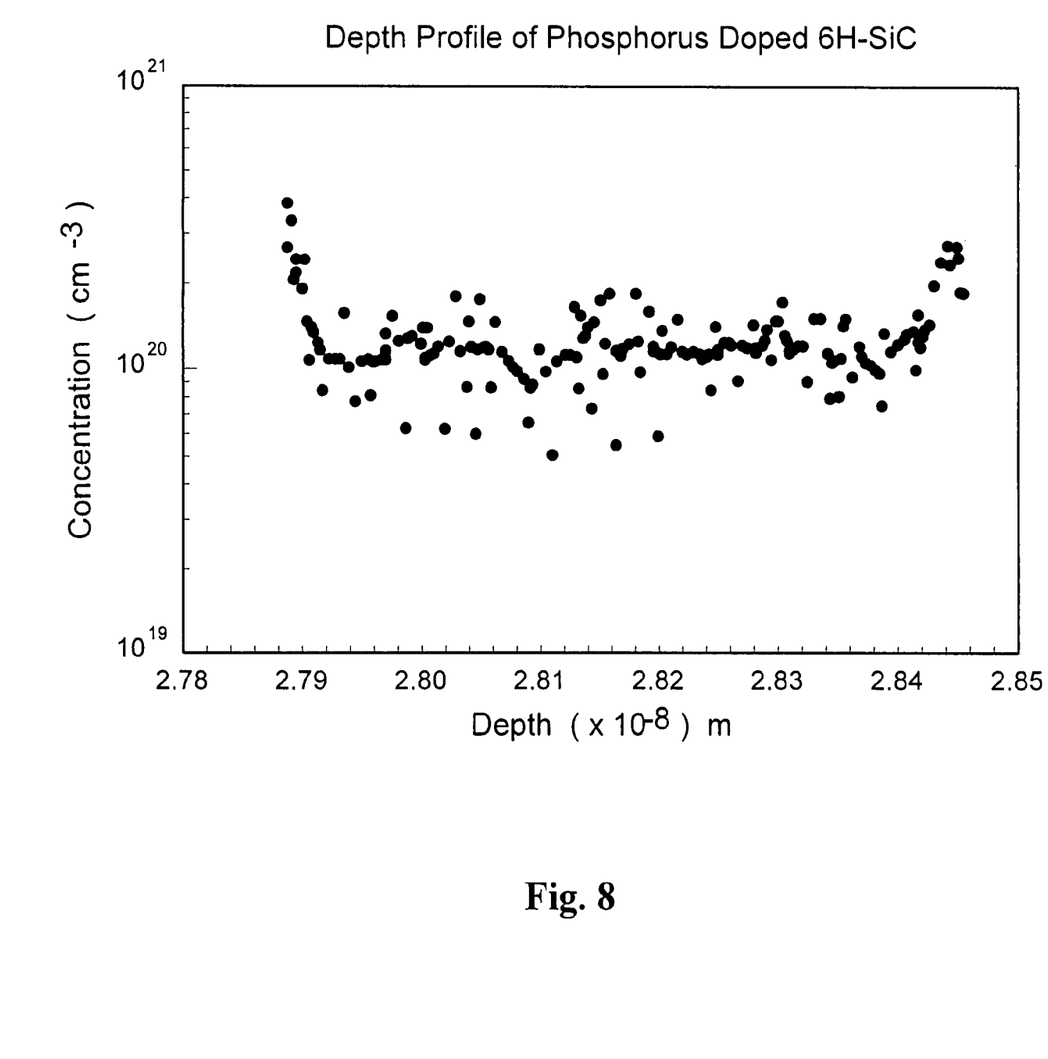
FIG. 8 illustrates the depth distribution of phosphorus dopant in 6H—SiC obtained using the method of FIG. 3 where the Layer L is phosphorus oxide.

FIG. 8 illustrates the depth distribution of phosphorus dopant in 6H—SiC obtained using the method of FIG. 3 where the Layer L is phosphorus oxide. The graph of FIG. 8 shows the concentration of the free charge carriers, which is an indication of the amount of phosphorus atoms introduced into the 6H—SiC sample. The test structures include Schottky barrier diodes, with diameter ranging from 60 to 300 microns, and fabricated by sputtering nickel in a vacuum chamber, then patterned by photolithography, and followed by lift-off. The amount of dopant in the sample is about 1020 cm-3, which is very high. This causes most of the test structures to be non-rectifying, and also limits the amount of reverse-bias voltage that can be applied to the test structure. This high doping level is suitable for making good ohmic contacts to silicon carbide.

Figure 9:
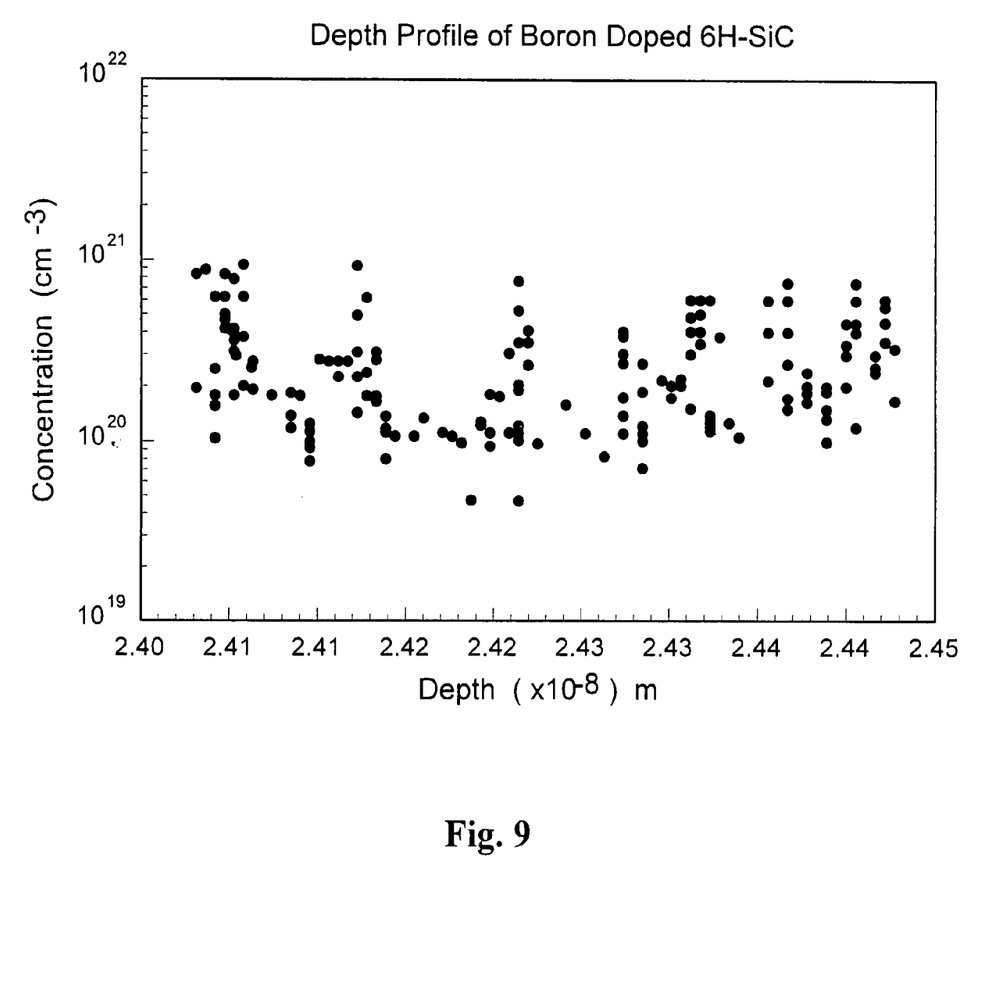
FIG. 9 illustrates the depth distribution of boron dopant in 6H—SiC obtained using the method of FIG. 6 where the Layer L is boron oxide.

FIG. 9 illustrates the depth distribution of boron dopant in 6H—SiC obtained using the method of FIG. 6 where the Layer L is boron oxide. The graph of FIG. 9 shows the concentration of the free charge carriers, which is an indication of the amount of boron atoms introduced into the 6H—SiC sample. The test structures include Schottky barrier diodes, with diameter ranging from 60 to 300 microns, and fabricated by sputtering nickel in a vacuum chamber, then patterned by photolithography, and followed by lift-off. The amount of dopant in the sample is just over 1020 cm-3, which is also high.

Figure 10:
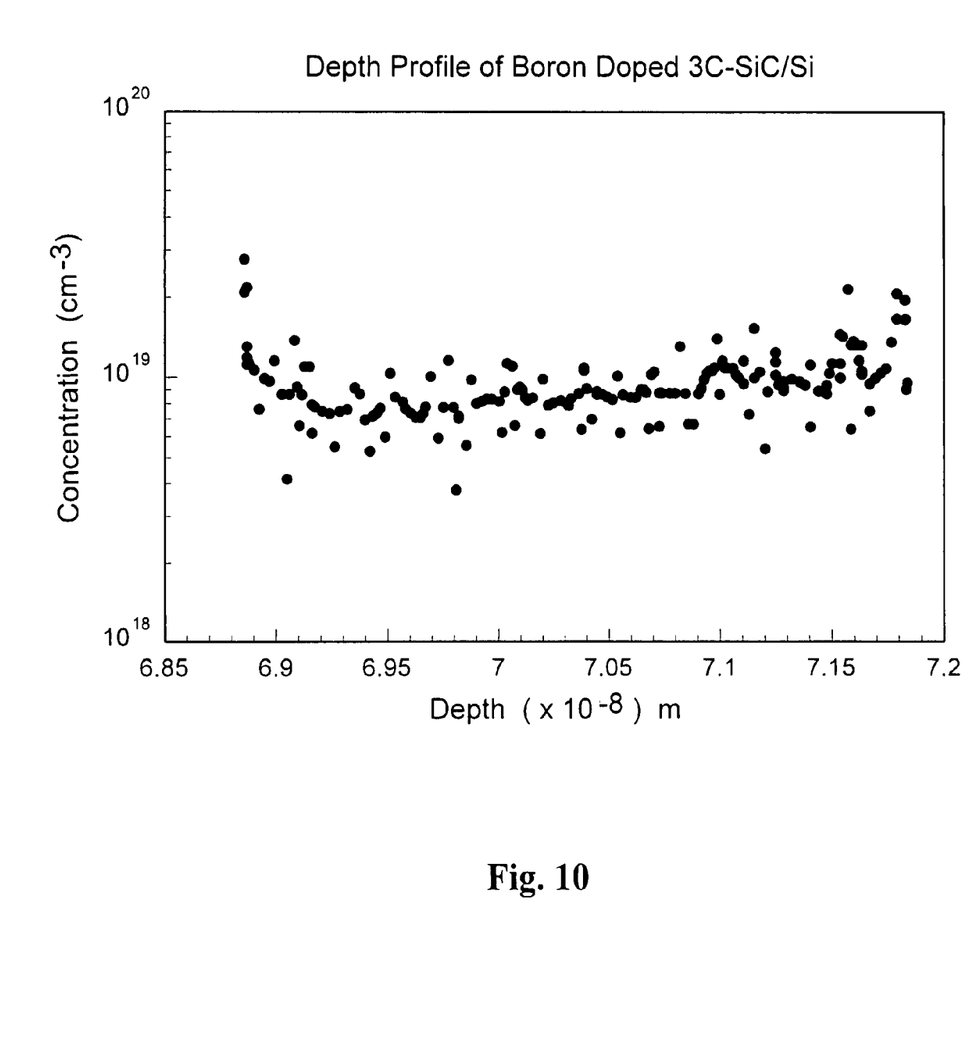
FIG. 10 illustrates the depth distribution of boron dopant in 3C—SiC on Si substrate obtained using the method of FIG. 6 where the Layer L is boron oxide.

FIG. 10 illustrates the depth distribution of phosphorus dopant in 3C—SiC on Si substrate obtained using the method of FIG. 3 where the Layer L is phosphorus oxide. The graph of FIG. 10 shows the concentration of the free charge carriers, which is an indication of the amount of phosphorus atoms introduced into the 3C—SiC sample. The test structures include Schottky barrier diodes, with diameter ranging from 60 to 300 microns, and fabricated by sputtering nickel in a vacuum chamber, then patterned by photolithography, and followed by lift-off. The amount of dopant in the sample is about 5×1019 cm-3, which is also high.

Figure 11:
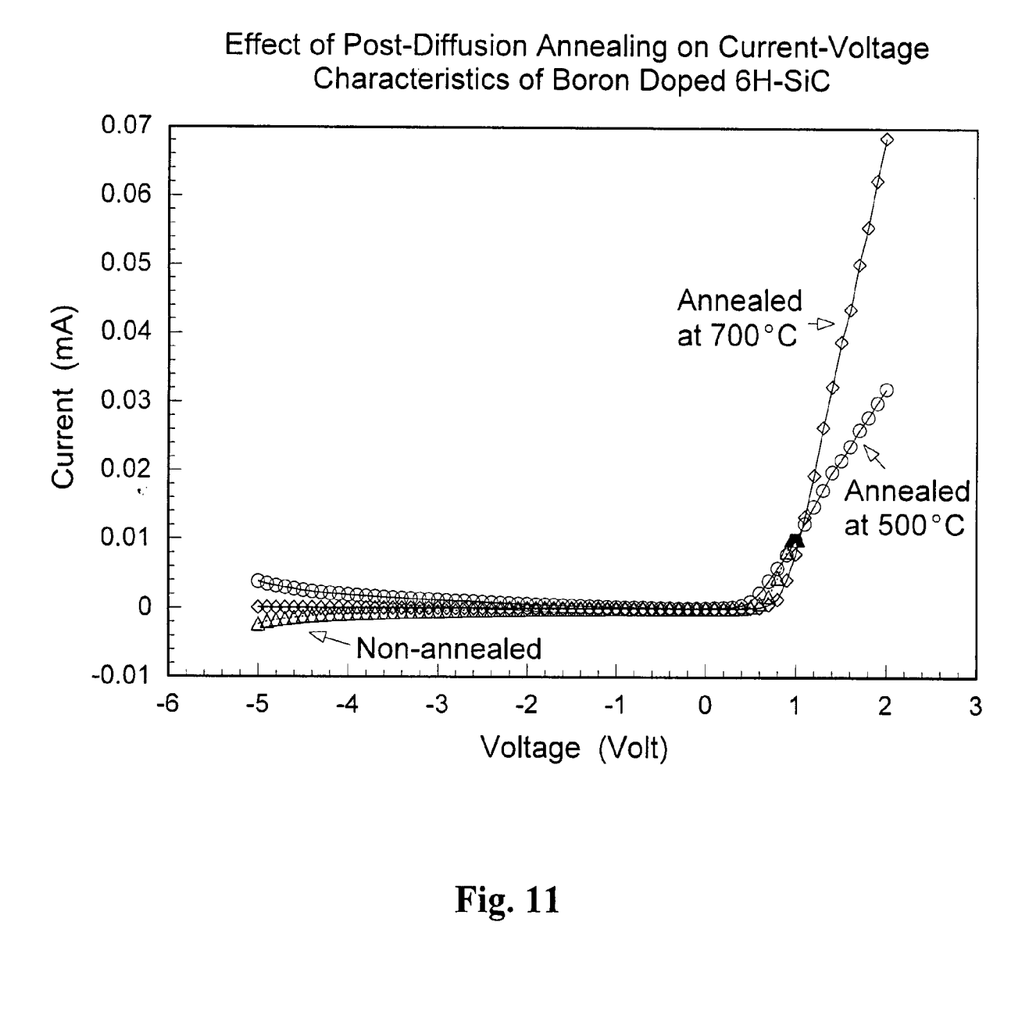
FIG. 11 illustrates the effect of post-diffusion annealing at different temperatures on the current-voltage characteristics of boron-doped 6H—SiC obtained using the method of FIG. 6 where the Layer L is boron oxide.

FIG. 11 illustrates the effect of post-diffusion annealing at different temperatures on the current-voltage characteristics of boron-doped 6H—SiC obtained using the method of FIG. 6 where the Layer L is boron oxide. Initially, only 20-30% of the Schottky barrier diodes showed nonlinear current-voltage characteristics immediately after boron diffusion. After a post-diffusion annealing at 500° C. in vacuum, all diodes show nonlinear characteristics indicating a reduction in the leakage current and a recovery from surface damage. The reverse-bias leakage current of the Schottky barrier diodes measured at −5 V decreased by about 4 times. Further post-diffusion annealing at 700° C. resulted in more improvement of the current-voltage characteristics due to annealing of defects in the doped layer. The reverse current was reduced by more than an order of magnitude. The current-voltage characteristics measured following a post-diffusion annealing at 900° C. showed a deterioration in the test structures, with an increased leakage current. The deterioration of the characteristics can be due to several reasons. For example, it is known that annealing of Ni—SiC contact at 1000° C. results in the formation of Ohmic contact and the deterioration of the diode characteristics can be due to reduction of the barrier height.

To utilize the method described herein, a layer L containing one or more components is deposited on silicon carbide forming a sample, the sample is dried if necessary, the sample is heated at approximately 650° C., the sample is also heated between 1150-1400° C. and the deposited layer L is removed. The result is a doped semiconductor. The method is implemented utilizing standard doping equipment or equipment modified/configured, as needed. To utilize a semiconductor generated by the method described herein, additional steps are able to be taken to further modify the characteristics of the semiconductor as desired. A generated semiconductor is able to be used for many purposes such as transistors, diodes and other devices.

In operation, the method described herein is able to generate a doped material such as a semiconductor at a low temperature. The advantages of the method is a) low temperature diffusion procedure that gives a better doping control, b) prevent decomposition and roughness of SiC surface, c) less surface defects, d) better device performance and higher yield and e) a wide range of doping concentration is able to be obtained more efficiently and easily without expensive facilities and procedures. The semiconductor generated using the method described operates as any semiconductor device generated using another method with the exception of fewer surface defects and other improvements.

Specifically, the improvements of the method described herein include, but are not limited to:

1) A layer L, containing an impurity and another component or components that are able to form a chemical bond with a silicon atom with a formation energy lower than that of the chemical bond between silicon and carbon in the silicon carbide surface region, when placed on silicon carbide and the sample is heated to 650° C. and subsequently annealed at 1150-1400° C., causes the formation of silicon vacancies in the surface region of silicon carbide, thus allowing the desired impurity to diffuse at a faster rate than normal into the silicon vacancies to produce p-type silicon carbide.

2) A layer L, containing an impurity including but not limited to boron, phosphorus and aluminum, and another component or components that are able to form a chemical bond with a carbon atom with a formation energy lower than that of the chemical bond between silicon and carbon in the silicon carbide surface region, when placed on silicon carbide and the sample is heated to 650° C. and subsequently annealed at 1150-1400° C., causes the formation of carbon vacancies in the surface region of silicon carbide, thus allowing the impurity to diffuse at a faster rate than normal into the carbon vacancies to produce p-type silicon carbide.

3) A layer L, containing an impurity and a component or components that are able to form a chemical bond with a silicon atom with a formation energy lower than that of the chemical bond between silicon and carbon in the silicon carbide surface region, and another component that contains carbon (such as a photoresist or another carbon-containing compound), when placed on silicon carbide and the sample is heated to 650° C. and subsequently annealed at 1150-1400° C., causes the formation of a carbon-rich surface region together with silicon vacancies in the surface region of silicon carbide, thus allowing the desired impurity to diffuse at a faster rate than normal to occupy the silicon vacancies preferentially.

4) A layer L, containing an impurity and a component or components that are able to form a chemical bond with carbon atom with a formation energy lower than that of the chemical bond between silicon and carbon in the silicon carbide surface region, and another component that contains silicon (such as silicon dioxide) when placed on silicon carbide and the sample heated to 650° and subsequently annealed at 1150-1400° C., causes the formation of a silicon-rich region as well as carbon vacancies in the surface region of silicon carbide, thus allowing the impurity to diffuse at a faster rate than normal to occupy the carbon vacancies preferentially.

5) The methods are able to be used on a 3C polytype of silicon carbide (3C—SiC) epilayer grown on silicon substrate.

6) The methods are able to be used on a 6H polytype of silicon carbide (6H—SiC) epilayer grown on 6H—SiC substrate.

7) The methods are able to be used on a 4H polytype of silicon carbide (4H—SiC) epilayer grown on 4H—SiC substrate.

8) The methods are able to be used on other polytypes of silicon carbide epilayer.

9) The layer L is able to be formed by vacuum evaporation, e-beam evaporation, sputtering of solid sources by chemical vapor deposition using gaseous or metalorganic sources or another method.

10) The vacancies in SiC into which the impurity is able to selectively occupy are able to be controlled.

In some implementations, the method described herein is able to be used for fabrication of ohmic contacts on n- and p-doped areas in the fabrication of SiC devices. In one embodiment of this method in the fabrication of SiC metal-oxide-semiconductor field effect transistors, the layer L 102, containing boron oxide, is deposited on the ion implanted areas of the source and drain contacts of p-type SiC, then the sample is annealed at 1150-1400° C. according to the procedure of FIG. 6. During this diffusion step, the ion implanted area is activated accompanied by diffusion of more p-type impurity atoms into the contact areas to produce ohmic contacts of low contact resistance. By avoiding the use of high temperature activation anneal, this method can reduce surface damage to produce better devices. In another embodiment of this method, the layer L 102 containing phosphorus oxide is deposited on the ion implanted areas of the source and drain contacts of n-type SiC, then the sample is annealed at 1150-1400° C. according to the procedure of FIG. 3. During this diffusion step, the ion-implanted area is activated accompanied by diffusion of more n-type impurity atoms into the contact areas to produce ohmic contacts of low contact resistance. In yet another embodiment, the device to be fabricated can be other silicon carbide diodes and transistors.

In some embodiments, a different material is doped instead of silicon carbide. In one embodiment of the method of this invention, an improved ohmic contact can be made on n-type gallium nitride by including an oxide of an n-type dopant, such as silicon, in the layer L 102, followed by diffusion annealing in oxygen at about 900-1000° C. for about 15 minutes. The layer L 102 is then removed, and a multilayer stack including titanium, aluminum, molybdenum, and gold layers is deposited on the sample, and the whole sample annealed at between 700-900° C. for 30 seconds to produce ohmic contact of low contact resistance. In another embodiment of this method, the layer L 102, containing an oxide of a p-type dopant and gallium oxide, is deposited on p-type gallium nitride, followed by diffusion annealing in oxygen at about 900-1000° C. for about 15 minutes. The layer L 102 is then removed followed by conventional metallization and anneal.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. An n-type silicon carbide semiconductor in which a group V element is used as donor impurity in a silicon carbide substrate, the n-type silicon carbide semiconductor formed by depositing a layer on a silicon carbide material, the layer including a group V impurity and an oxide, the layer and the silicon carbide material forming a sample heated at a first temperature forming one or more vacancies in the silicon carbide substrate and heated at a second temperature, thereby forming a twice-heated sample.

2. The semiconductor of claim 1 wherein depositing is selected from the group consisting of dipping, spinning, brushing and dropping droplets with a dropper.

3. The semiconductor of claim 1 wherein the layer comprises phosphorus oxide.

4. The semiconductor of claim 1 wherein the first temperature is approximately 650° C.-1000° C.

5. The semiconductor of claim 1 wherein the second temperature is above 1000° C. and below the decomposition temperature of a surface of the layer.

6. The semiconductor of claim 1 wherein the sample is dried.

7. The semiconductor of claim 1 wherein the deposited layer is removed from the sample, upon the sample cooling.

8. The semiconductor of claim 7 wherein the deposited layer is removed by etching in a solution of hydrofluoric acid in water.

9. The semiconductor of claim 1, wherein the phosphorus impurity fills the one or more vacancies in the silicon carbide substrate at the second temperature.

10. The semiconductor of claim 1, wherein the one or more vacancies are formed in a thermodynamic energy favorable reaction.

11. The semiconductor of claim 1, wherein the layer comprises an element that is able to form a chemical bond with silicon with a formation energy lower than that of the bonding between silicon and carbon atoms in a surface region of silicon carbide.

12. The semiconductor of claim 1, wherein the layer comprises an element that is able to bond with a carbon atom with a formation energy lower than that of the bonding between silicon and carbon in a surface region of silicon carbide.

13. A p-type silicon carbide semiconductor in which a group III element is used as an acceptor impurity in a silicon carbide substrate, the p-type silicon carbide semiconductor formed by depositing a layer on a silicon carbide material, the layer including an impurity selected from the group consisting of the group III impurity, and an oxide, the layer and the silicon carbide material forming a sample heated at a first temperature forming one or more vacancies in the silicon carbide substrate and heated at a second temperature, thereby forming a twice-heated sample.

14. The semiconductor of claim 13 wherein the layer comprises a boron impurity.

15. The semiconductor of claim 13 wherein the layer comprises boron oxide.

16. The semiconductor of claim 13 wherein the layer comprises an element that is able to form a chemical bond with silicon with a formation energy lower than that of the bonding between silicon and carbon atoms in a surface region of silicon carbide.

17. The semiconductor of claim 16, wherein the element comprise a metal.

18. The semiconductor of claim 13 wherein the first temperature is approximately 650° C.-1000° C.

19. The semiconductor of claim 13 wherein the second temperature is above 1000° C. and below the decomposition temperature of a surface of the layer.

20. The semiconductor of claim 13 wherein the layer comprises an element that is able to bond with a carbon atom with a formation energy lower than that of the bonding between silicon and carbon in a surface region of silicon carbide.

21. The semiconductor of claim 20, wherein the element comprise a metal.

22. The semiconductor of claim 1, wherein the silicon carbide material forms a Si—O bond at the first temperature.

23. The semiconductor of claim 22, wherein the oxygen of Si—O is from the oxide.

24. The semiconductor of claim 13, wherein the one or more vacancies are formed in a thermodynamic energy favorable reaction.

* * * * *